(12) United States Patent
Cheng (10) Patent No.: US 12,489,025 B2
(45) Date of Patent: Dec. 2, 2025

(54) ENHANCED SEMICONDUCTOR STRUCTURES AND MANUFACTURING METHODS THEREOF

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 756 days.

(21) Appl. No.: 17/628,534

(22) PCT Filed: Sep. 10, 2020

(86) PCT No.: PCT/CN2020/114581
§ 371 (c)(1),
(2) Date: Jan. 19, 2022

(87) PCT Pub. No.: WO2022/052001
PCT Pub. Date: Mar. 17, 2022

(65) Prior Publication Data
US 2022/0359334 A1 Nov. 10, 2022

(51) Int. Cl.
*H01L 23/31* (2006.01)
*H01L 21/02* (2006.01)
(Continued)

(52) U.S. Cl.
CPC .... *H01L 23/3192* (2013.01); *H01L 21/02164* (2013.01); *H01L 21/0217* (2013.01);
(Continued)

(58) Field of Classification Search
None
See application file for complete search history.

(56) References Cited

U.S. PATENT DOCUMENTS 10,749,021 B2    8/2020  Huang et al.
2006/0273347 A1  12/2006 Hikita et al.
(Continued)

FOREIGN PATENT DOCUMENTS

CN    10268339 A    9/2012
CN    105355555 A   2/2016
(Continued)

OTHER PUBLICATIONS

ISA State Intellectual Property Office of the People's Republic of China, International Search Report Issued in Application No. PCT/CN2020/114581, Jun. 17, 2021, WIPO, 4 pages.
(Continued)

*Primary Examiner* — Brent A. Fairbanks
*Assistant Examiner* — Derek L Nielsen
(74) *Attorney, Agent, or Firm* — Christopher R. Carroll; The Small Patent Law Group LLC (57) ABSTRACT

The present application provides a semiconductor structure and a manufacturing method thereof. The semiconductor structure includes: a semiconductor substrate, a heterojunction structure, a cap layer, a first passivation layer and a second passivation layer disposed from bottom to up; a trench penetrating through the first passivation layer and the second passivation layer; and a P-type semiconductor layer located at least on an inner wall of the trench. After a part of the second passivation layer is dry etched to form the trench, the first passivation layer can be used for etching endpoint detection to avoid over etching. A part of the first passivation layer exposed by the trench of the second passivation layer can be removed by wet etching.

17 Claims, 6 Drawing Sheets

(51) Int. Cl.
  *H01L 23/29*    (2006.01)
  *H10D 30/01*    (2025.01)
  *H10D 30/47*    (2025.01)
  *H10D 62/824*   (2025.01)
  *H10D 62/85*    (2025.01)

(52) U.S. Cl.
  CPC ...... *H01L 21/02178* (2013.01); *H01L 23/291* (2013.01); *H01L 23/3171* (2013.01); *H10D 30/015* (2025.01); *H10D 30/475* (2025.01); *H10D 62/824* (2025.01); *H10D 62/8503* (2025.01)

(56) References Cited

U.S. PATENT DOCUMENTS

| | | | | |
|---|---|---|---|---|
| 2009/0146182 | A1* | 6/2009 | Hikita | H10D 30/475 |
| | | | | 257/190 |
| 2012/0056191 | A1* | 3/2012 | Endo | H01L 29/7787 |
| | | | | 257/E29.246 |
| 2014/0239346 | A1 | 8/2014 | Green et al. | |
| 2015/0123168 | A1* | 5/2015 | Green | H10D 30/87 |
| | | | | 257/192 |
| 2016/0064539 | A1* | 3/2016 | Lu | H01L 29/205 |
| | | | | 438/666 |
| 2017/0125571 | A1 | 5/2017 | Huang et al. | |
| 2019/0311914 | A1 | 10/2019 | Cheng | |

FOREIGN PATENT DOCUMENTS

| | | |
|---|---|---|
| CN | 107424919 A | 12/2017 |
| CN | 108133961 A | 6/2018 |
| CN | 108417493 A | 8/2018 |
| CN | 213635994 U | 7/2021 |
| WO | 2019037116 A1 | 2/2019 |

OTHER PUBLICATIONS

ISA State Intellectual Property Office of the People's Republic of China, Written Opinion of the International Searching Authority Issued in Application No. PCT/CN2020/114581, Jun. 17, 2021, WIPO, 6 pages.(Submitted with Machine/Partial Translation).

State Intellectual Property Office of the People's Republic of China, Office Action and Search Report Issued in Application No. 202080103838 7, May 17, 2025, 17 pages. (Submitted with Machine Translation).

* cited by examiner

ENHANCED SEMICONDUCTOR STRUCTURES AND MANUFACTURING METHODS THEREOF

This application is a national phase entry of and claims priority to International Patent Application No. PCT/CN2020/114581 (filed 10 Sep. 2020), the entire disclosure of which is incorporated herein by reference.

TECHNICAL FIELD

This application relates to the field of semiconductor technologies, and in particular, to enhanced semiconductor structures and manufacturing methods thereof.

BACKGROUND

Group III nitride semiconductor materials are the third generation of new semiconductor materials following the first and second generations of semiconductor materials such as Si and GaAs. The group III nitride semiconductor materials have a high saturated electron mobility, a high breakdown voltage and a wide band gap. Because of these characteristics, GaN-based High Electron Mobility Transistor (HEMT) devices have broad application prospects.

When existing group III nitride semiconductor HEMT devices are used as high-frequency devices or high-voltage, high-power switching devices, there is a phenomenon of "current collapse". That is, when a device is working in a direct-current pulse mode or a high frequency mode, a drain output current cannot keep up with a gate control signal changing, resulting in a case where the drain current will decrease instantaneously and a dynamic on-resistance will increase, which seriously affects device applications. In the final analysis, this phenomenon is caused by a polarization effect resulting a formation of two-dimensional electron gas (2 DEG) in a heterojunction interface channel and a formation of positively charged ionized donors with a charge density equivalent to a 2 DEG concentration on an upper surface of a barrier layer in a heterojunction at the same time. The principle is that when an HEMT device is working in an off state, an electric field intensity on a side of a gate biased toward a drain reaches its maximum, so that electrons on the gate jump to a surface of the barrier layer under the action of an electric field force, and horizontally migrate to a direction of the drain among their surface donor energy levels, neutralizing surface ionized donors and depleting channel electrons to form a "virtual gate"; when the working state of the HEMT device is changed from the off state to an on state, the electrons on the surface of the barrier layer migrated from the gate will migrate back to the gate at a slow rate. However, when the HEMT device is switched at a certain frequency, the electrons on the surface of the barrier layer cannot migrate back to the gate in time, causing a resistance in the on state to increase, which may be several times as high as a static on-resistance, that is, current collapse.

In view of this, there is a need to provide new enhanced semiconductor structures and manufacturing methods thereof to solve the above-mentioned problems.

SUMMARY

An object of the present disclosure is to provide enhanced semiconductor structures and manufacturing methods thereof to solve the problem of current collapse.

In order to achieve the above object, a first aspect of the present disclosure provides a method of manufacturing an enhanced semiconductor structure, including:
  forming a heterojunction structure, a cap layer, a first passivation layer and a second passivation layer sequentially on a semiconductor substrate;
  forming a trench penetrating through the first passivation layer and the second passivation layer, where a part of the second passivation layer is removed by dry etching, the first passivation layer is used as an etching stop layer during the dry etching, a part of the first passivation layer is removed by wet etching, and the cap layer is used to protect the heterojunction structure during the wet etching; and
  forming a P-type semiconductor layer at least on an inner wall of the trench.

Optionally, the P-type semiconductor layer is a p-GaN layer, a p-AlGaN layer, a stacked structure of the p-AlGaN layer and the p-GaN layer, or a stacked structure of an AlGaN layer and a p-GaN layer.

Optionally,
  when the P-type semiconductor layer is the p-GaN layer, the P-type semiconductor layer is selectively grown, and the P-type semiconductor layer is located only in the trench; or
  when the P-type semiconductor layer is the p-AlGaN layer, the P-type semiconductor layer is whole-surface epitaxially grown and is selectively etched, and the p-AlGaN layer is further located on the second passivation layer in a gate region; or
  when the P-type semiconductor layer is a stacked structure of the p-AlGaN layer and the p-GaN layer disposed from bottom to up, the P-type semiconductor layer is whole-surface epitaxially grown and is selectively etched, and the stacked structure of the p-AlGaN layer and the p-GaN layer is further located on the second passivation layer in a gate region; or
  when the P-type semiconductor layer is a stacked structure of the AlGaN layer and the p-GaN layer disposed from bottom to up, the P-type semiconductor layer is whole-surface epitaxially grown and is selectively etched, the stacked structure of the AlGaN layer and the p-GaN layer is further located on the second passivation layer in a gate region.

Optionally, a combination of materials of the second passivation layer and the first passivation layer includes: $SiN_x$/amorphous AlN, $SiN_x/SiO_2$, or $SiO_2/SiN_x$.

Optionally, a material of the cap layer includes GaN.

Optionally, forming a gate on the P-type semiconductor layer, and forming a source and a drain on both sides of the gate.

Optionally, the heterojunction structure includes a channel layer and a barrier layer from bottom to up, and the source and the drain are in contact with the channel layer or the barrier layer.

According to a second aspect of the present disclosure, there is provided an enhanced semiconductor structure, including:
  a semiconductor substrate, a heterojunction structure, a cap layer, a first passivation layer and a second passivation layer disposed from bottom to up;
  a trench penetrating through the first passivation layer and the second passivation layer; and
  a P-type semiconductor layer located at least on an inner wall of the trench.

Optionally, the P-type semiconductor layer is a p-GaN layer; or the P-type semiconductor layer is a p-AlGaN layer, and the p-AlGaN layer is further located on the second passivation layer in a gate region; or the P-type semiconductor layer is a stacked structure of a p-AlGaN layer and a p-GaN layer disposed from bottom to up, and the stacked structure of the p-AlGaN layer and the p-GaN layer is further located on the second passivation layer in a gate region; or the P-type semiconductor layer is a p-GaN layer, an AlGaN layer is between the p-GaN layer and the cap layer, and a stacked structure of the AlGaN layer and the p-GaN layer is further located on the second passivation layer in a gate region.

Optionally, a combination of materials of the second passivation layer and the first passivation layer includes: SiNx/amorphous AlN, $SiN_x/SiO_2$, or $SiO_2/SiN_x$.

Optionally, a material of the cap layer includes GaN.

Optionally, the heterojunction structure includes a group III nitride material.

Optionally, the enhanced semiconductor structure further includes: a gate located on the P-type semiconductor layer; and a source and a drain located on both sides of the gate.

Optionally, the heterojunction structure includes a channel layer and a barrier layer from bottom to up, and the source and the drain are in contact with the channel layer or the barrier layer.

Optionally, the heterojunction structure includes a group III nitride material.

Optionally, the enhanced semiconductor structure further includes: an N-type ion heavily doped layer located on the P-type semiconductor layer in the gate region, and/or on the heterojunction structure in a source region, and/or the heterojunction structure in a drain region.

Optionally, the enhanced semiconductor structure further includes: a gate located on the N-type ion heavily doped layer in the gate region, a source located on the N-type ion heavily doped layer in the source region, and a drain located on the N-type ion heavily doped layer in the drain region.

Compared with the prior art, the present disclosure has the following beneficial effects:

1) After a part of the second passivation layer is dry etched to form the trench, the first passivation layer can be used for etching endpoint detection when the second passivation layer is dry etched to form the trench to avoid over etching. A part of the first passivation layer exposed by the trench of the second passivation layer can be removed by wet etching. When the exposed part of first passivation layer is removed by the wet etching, due to the cap layer has extremely high stability, the wet etching enables not only the exposed part of first passivation layer to be completely removed, but also the cap layer to be not damaged. The non-damaged cap layer can effectively reduce surface defects of the heterojunction structure to decrease a probability of electrons being trapped by the defects and further increase a rate of electrons being released back to the gate, thereby weakening a current collapse effect and reducing a dynamic on-resistance.

1) In an alternative, a material for the cap layer is GaN. Negative polarization charges between the GaN cap layer and the heterojunction structure enable an electric field in the heterojunction structure to be enhanced, which can increase the rate of electrons being released back to the gate, thereby weakening the current collapse effect and reducing the dynamic on-resistance.

3) In an alternative, a) a material for the second passivation layer is $SiN_x$, and a material for the first passivation layer is amorphous AlN. $SiN_x$ can be removed by dry etching with an F-containing gas. The F-containing gas has a high etching selection ratio for $SiN_x$ and amorphous AlN, that is, it has a faster etching rate for $SiN_x$ and a slower etching rate for amorphous AlN. Therefore, an endpoint of the dry etching can be effectively detected to stop the dry etching in time. Amorphous AlN exposed by the second passivation layer can be removed with an alkaline solution such as KOH or NaOH, and the alkaline solution such as KOH or NaOH is non-corrosive to the Ga surface of the GaN cap layer. As a result, the GaN cap layer will not be damaged while amorphous AlN is removed.

Or b) the material for the second passivation layer is $SiN_x$, and the material for the first passivation layer is $SiO_2$. Or c) the material for the second passivation layer is $SiO_2$, and the material for the first passivation layer is $SiN_x$. $SiN_x$ or $SiO_2$ can be removed by dry etching with a mixed gas of a CF-based gas and oxygen, and an etching selection ratio of $SiN_x$ and $SiO_2$ can be increased or decreased by adjusting a mixing ratio of the CF-based gas and oxygen. For example, in the b), increasing an oxygen content can significantly increase an etching rate of $SiN_x$. Therefore, $SiO_2$ can effectively detect an endpoint of the dry etching to stop the dry etching in time. In the c), reducing an oxygen content can significantly increase an etching rate of $SiO_2$. Therefore, $SiN_x$ can effectively detect an endpoint of the dry etching to stop the dry etching in time. $SiO_2$ exposed by the second passivation layer can be removed with an HF solution. $SiN_x$ can be removed with a hot phosphoric acid solution. HF and hot phosphoric acid are non-corrosive to the GaN cap layer. As a result, the GaN cap layer will not be damaged while the first passivation layer is removed.

BRIEF DESCRIPTION OF THE DRAWINGS

FIG. 5-1 is a schematic diagram illustrating another cross-sectional structure of the enhanced semiconductor structure according to the first embodiment of the present disclosure.

To facilitate understanding of the present disclosure, all reference signs appearing in the present disclosure are listed below:
Enhanced semiconductor structure 1, 2, 3, 4, 5
Semiconductor substrate 10
Heterojunction structure 11
Cap layer 12
First passivation layer 13
Second passivation layer 14
Trench 15
Patterned mask layer 16
P-type semiconductor layer 17
N-type ion heavily doped layer 18
Channel layer 11a
Barrier layer 11b
Gate 19a
Source 19b
Drain 19c
Gate region 1a
Drain region 1c
Source region 1b

DETAILED DESCRIPTION OF THE EMBODIMENTS

In order to make the above-mentioned objects, features and advantages of the present disclosure more obvious and understandable, specific embodiments of the present disclosure will be described in detail below with reference to the accompanying drawings.

Figure 1:
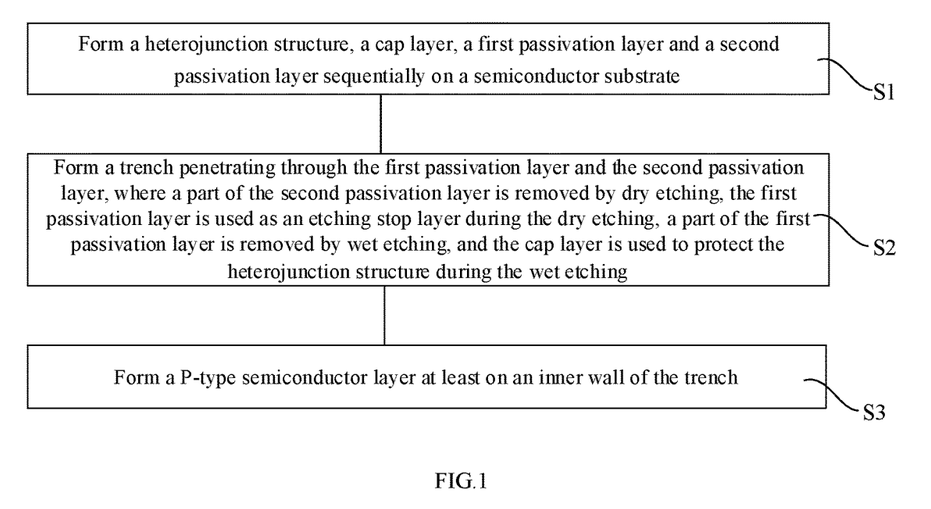
FIG. 1 is a flowchart illustrating a method of manufacturing an enhanced semiconductor structure according to a first embodiment of the present disclosure.
Figure 2:
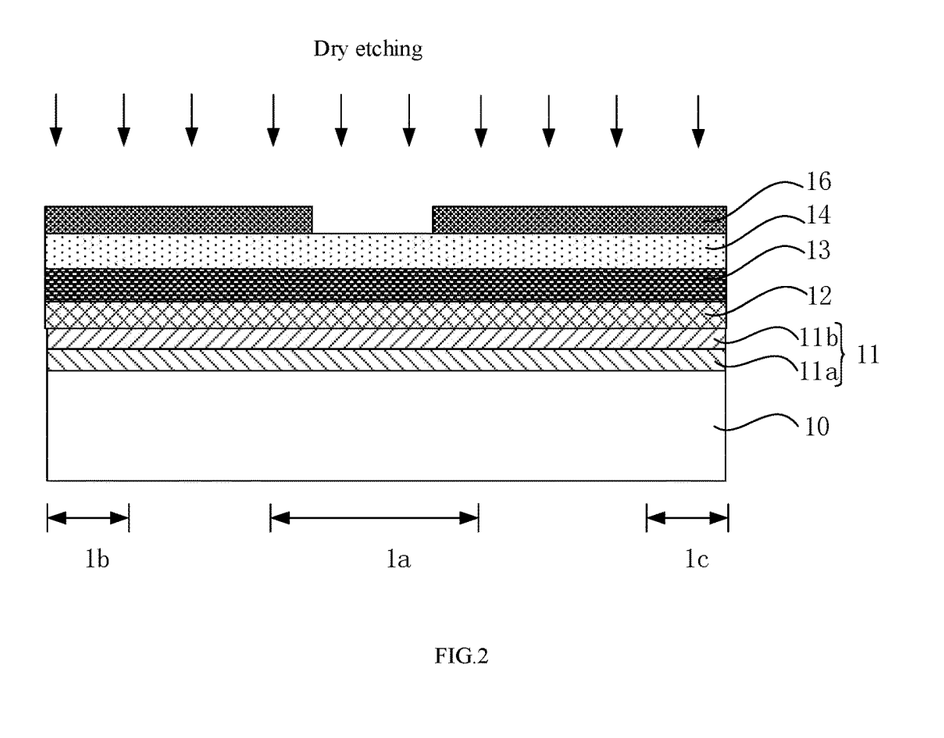
FIGS. 2 to 4 are schematic diagrams illustrating intermediate structures corresponding to processes in FIG. 1.
Figure 3:
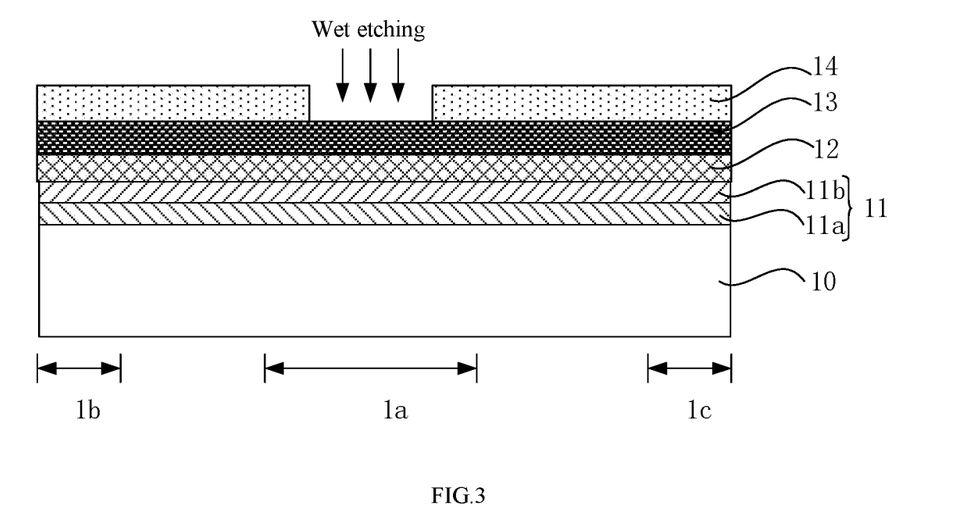
Figure 4:
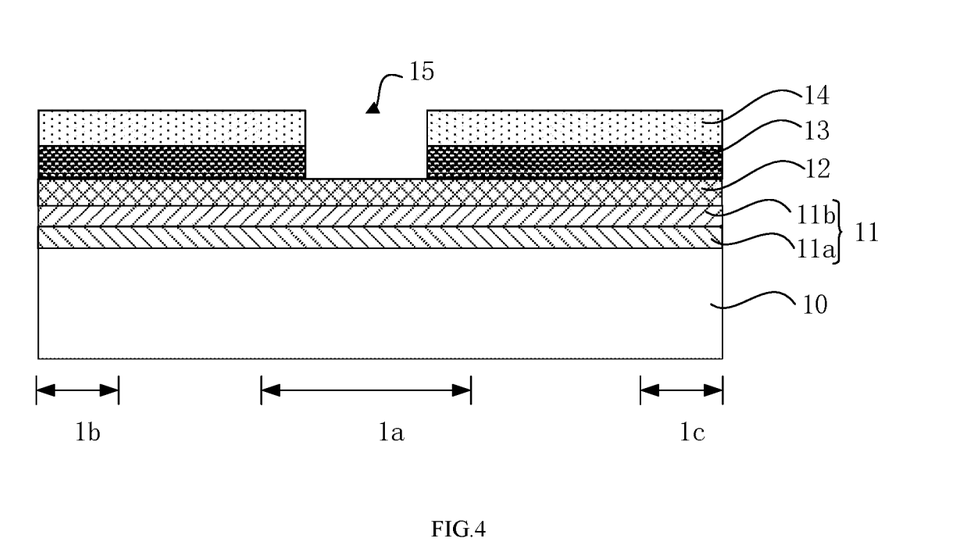
Figure 5:
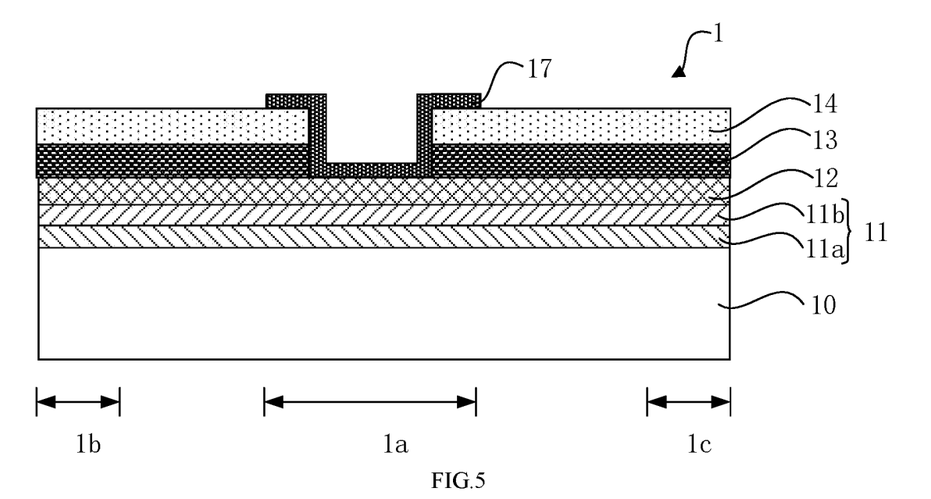
FIG. 5 is a schematic diagram illustrating a cross-sectional structure of the enhanced semiconductor structure according to the first embodiment of the present disclosure.

FIG. 1 is a flowchart illustrating a method of manufacturing an enhanced semiconductor structure according to a first embodiment of the present disclosure. FIGS. 2 to 4 are schematic diagrams illustrating intermediate structures corresponding to processes in FIG. 1. FIG. 5 is a schematic diagram illustrating a cross-sectional structure of the enhanced semiconductor structure according to the first embodiment of the present disclosure.

First, referring to step S1 in FIG. 1 and FIG. 2, a heterojunction structure 11, a cap layer 12, a first passivation layer 13 and a second passivation layer 14 are sequentially formed on a semiconductor substrate 10.

The semiconductor substrate 10 may be made of a group III nitride material. The group III nitride material may be at least one of GaN, AlGaN, InGaN or AlInGaN.

It should be noted that in this embodiment, chemical elements are used to represent a material, but a molar ratio of the chemical elements in the material is not limited. For example, a GaN material contains a Ga element and an N element, but a molar ratio of the Ga element to the N element is not limited; an AlGaN material contains Al, Ga and N elements, but their molar ratio is not limited.

Materials for the semiconductor substrate 10 may further include: at least one of sapphire, silicon carbide or silicon, or at least one of sapphire, silicon carbide or silicon and a group III nitride material thereon, which is not limited in this embodiment.

The heterojunction structure 11 may include a channel layer 11a and a barrier layer 11b from bottom to up. Two-dimensional electron gas may be formed at an interface between the channel layer 11a and the barrier layer 11b. Specifically, a) the channel layer 11a and the barrier layer 11b may each include one layer; or b) the channel layer 11a and the barrier layer 11b may each include multiple layers, which are alternately distributed; or c) there may include one channel layer 11a and two or more barrier layers 11b to meet different functional requirements.

A combination of materials for the channel layer 11a and the barrier layer 11b may include: GaN/AlN, GaN/InN, GaN/AlGaN, GaAs/AlGaAs, GaN/InAlN, or InN/InAlN.

When a material for the barrier layer 11b is AlGaN, Al may account for 5% to 25% in a molar ratio of AlGaN. The barrier layer 11b may have a thickness in a range from 1 nm to 20 nm.

A process for forming the channel layer 11a and/or the barrier layer 11b may include: Atomic Layer Deposition (ALD), or Chemical Vapor Deposition (CVD), or Molecular Beam Epitaxy (MBE), or Plasma Enhanced Chemical Vapor Deposition (PECVD), or Low Pressure Chemical Vapor Deposition (LPCVD), or Metal-Organic Chemical Vapor Deposition (MOCVD), or a combination thereof.

Between the heterojunction structure 11 and the semiconductor substrate 10, there may include a nucleation layer and a buffer layer (not shown in figures) from bottom to up. A material for the nucleation layer may be, for example, AlN or AlGaN. A material for the buffer layer may be at least one of AlN, GaN, AlGaN or AlInGaN. The nucleation layer can alleviate problems of lattice mismatch and thermal mismatch between an epitaxially grown semiconductor layer, for example, the channel layer 11a in the heterojunction structure 11, and the semiconductor substrate 10. The buffer layer can reduce a dislocation density and a defect density of the epitaxially grown semiconductor layer, and improve a crystal quality.

A material for the cap layer 12 may be GaN. An upper surface of the GaN cap layer may be a Ga surface. GaN crystals have a wurtzite structure, in which Ga and N atomic layers are stacked in a manner of hexagonal layers ABA-BAB, and each Ga(N) atom forms a bond with surrounding 4 N(Ga) atoms in a diamond-like tetrahedral structure. It should be noted that, taking a Ga—N bond parallel to a C axis ([0001] crystal orientation) as a reference, if Ga atoms in each Ga—N bond are farther away from a lower surface, the upper surface is a Ga surface; N atoms in each Ga—N bond are farther away from the lower surface, the upper surface is an N surface.

A method for forming the cap layer 12 can refer to the process for forming the channel layer 11a or the barrier layer 11b.

A material for the first passivation layer 13 may be amorphous AlN. A material for the second passivation layer 14 may be $SiN_x$. In other alternatives, a combination of materials for the second passivation layer 14 and the first passivation layer 13 may be: $SiN_x/SiO_2$, or $SiO_2/SiN_x$. A process for forming amorphous AlN may include: Metal-Organic Chemical Vapor Deposition (MOCVD), or Chemical Vapor Deposition (CVD), or Physical Vapor Deposition (PVD), or Atomic Layer Deposition (ALD). A process for forming $SiN_x$ or $SiO_2$ may include: Chemical Vapor Deposition (CVD), or Physical Vapor Deposition (PVD).

In addition, the material for the second passivation layer 14 may be $SiN_x$ formed through Low Pressure Chemical Vapor Deposition (LPCVD). The material for the first passivation layer 13 may be $SiN_x$ formed through Plasma Enhanced Chemical Vapor Deposition (PECVD).

The above structure includes a gate region 1a, and a source region 1b and a drain region 1c located on both sides of the gate region 1a.

Next, referring to step S2 in FIG. 1 and FIGS. 2 to 4, a trench 15 penetrating through the first passivation layer 13 and the second passivation layer 14 is formed; a part of the second passivation layer 14 is removed by dry etching, and the first passivation layer 13 is used as an etching stop layer during the dry etching; a part of the first passivation layer 13 is removed by wet etching, and the cap layer 12 is used to protect the heterojunction structure 11 during the wet etching.

Referring to FIG. 2, a patterned mask layer 16 can be used as a mask in the dry etching. A material for the patterned mask layer 16 may be photoresist.

Referring to FIG. 3, in this embodiment, the wet etching is maskless etching. In other embodiments, a mask layer can be used as a mask in the wet etching, and the mask layer has an opening exposing the first passivation layer 13.

When the material for the second passivation layer 14 is $SiN_x$, and the material for the first passivation layer 13 is amorphous AlN, $SiN_x$ can be removed by dry etching with an F-containing gas ($CF_4$, $C_3F_8$ or the like). The F-containing gas has a higher etching selection ratio for $SiN_x$ than amorphous AlN, that is, it has a faster etching rate for SiN and a slower etching rate for amorphous AlN. Therefore, an endpoint of the dry etching can be effectively detected to stop the dry etching in time. Amorphous AlN exposed by the second passivation layer 14 can be removed with an alkaline solution such as KOH or NaOH, and the alkaline solution such as KOH or NaOH is non-corrosive to the Ga surface of the GaN cap layer. As a result, the GaN cap layer will not be damaged while amorphous AlN is removed.

When the material for the second passivation layer 14 is $SiN_x$, and the material for the first passivation layer 13 is $SiO_2$, $SiN_x$ can be removed by dry etching with a mixed gas of a CF-based gas and oxygen, and an etching rate of SiN can be significantly increased by adjusting a mixing ratio of the CF-based gas and oxygen, for example, increasing an oxygen content. Therefore, $SiO_2$ can effectively detect an endpoint of the dry etching to stop the dry etching in time. $SiO_2$ exposed by the second passivation layer 14 can be removed with an HF solution, and HF is non-corrosive to the GaN cap layer. As a result, the GaN cap layer will not be damaged while the first passivation layer 13 is removed.

When the material for the second passivation layer 14 is $SiO_2$, and the material for the first passivation layer 13 is $SiN_x$, $SiO_2$ can be removed by dry etching with a mixed gas of a CF-based gas and oxygen, and an etching rate of $SiO_2$ can be significantly increased by adjusting a mixing ratio of the CF-based gas and oxygen, for example, reducing an oxygen content. Therefore, $SiN_x$ can effectively detect an endpoint of the dry etching to stop the dry etching in time. $SiN_x$ exposed by the second passivation layer 14 can be removed with a hot phosphoric acid solution, and hot phosphoric acid is non-corrosive to the GaN cap layer. As a result, the GaN cap layer will not be damaged while the first passivation layer 13 is removed.

Next, referring to step S3 in FIG. 1 and FIG. 5, a P-type semiconductor layer 17 is formed at least on an inner wall of the trench 15.

In this embodiment, the P-type semiconductor layer 17 can deplete the two-dimensional electron gas in the heterojunction structure 11, and cut off channel conduction. That is, the P-type semiconductor layer 17 is used to form a normally-off state. In other words, an enhanced structure is formed.

The P-type semiconductor layer 17 may be made of a group III nitride material, and its corresponding formation method can refer to the process for forming the channel layer 11a or the barrier layer 11b. P-type doping ions in the P-type semiconductor layer 17 may be at least one of kinds of Mg ions, Zn ions, Ca ions, Sr ions or Ba ions. An in-situ doping method may be used. That is, the P-type semiconductor layer 17 is doped while growing.

More specifically, in the embodiment shown in FIG. 5, a material for the formed P-type semiconductor layer 17 is p-AlGaN. The p-AlGaN layer can be epitaxially grown on the inner wall of the trench 15 and the second passivation layer 14. Then, the p-AlGaN layer outside the gate region 1a is removed by dry etching or wet etching, and the p-AlGaN layer on the second passivation layer 14 in the gate region 1a is remained.

The dry etching can be Inductively Coupled Plasma (ICP) etching. Etching gases may include $Cl_2$ and $BCl_3$. Alkaline solutions such as KOH and NaOH can be used for the wet etching.

In some embodiments, the formed P-type semiconductor layer 17 may be a stacked structure of a p-AlGaN layer and a p-GaN layer distributed from bottom to up. At this time, the stacked structure of the p-AlGaN layer and the p-GaN layer is located not only on the inner wall of the trench 15, but also on the second passivation layer 14 in the gate region 1a.

In some embodiments, a material for the formed P-type semiconductor layer 17 is a stacked structure of AlGaN and p-GaN distributed from bottom to up. At this time, before the P-type semiconductor layer 17 is formed, an AlGaN layer is formed on the inner wall of the trench 15 and the second passivation layer 14; then, the stacked structure of the AlGaN layer and the p-GaN layer outside the gate region 1a is removed by dry etching or wet etching, and the stacked structure of the AlGaN layer and the p-GaN layer on the second passivation layer 14 in the gate region 1a is remained.

Figure 51:
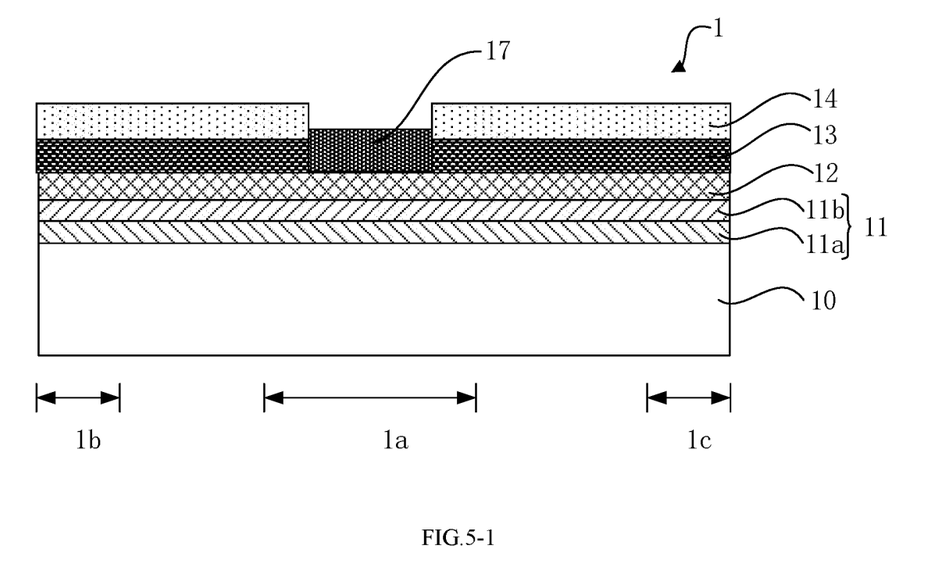

In some embodiments, as shown in FIG. 5-1, a material for the formed P-type semiconductor layer 17 is p-GaN, and the p-GaN layer can be only selectively epitaxially grown in the trench 15.

Referring to FIG. 5 and FIG. 5-1, an enhanced semiconductor structure 1 according to the first embodiment includes:
  a semiconductor substrate 10, a heterojunction structure 11, a cap layer 12, a first passivation layer 13, and a second passivation layer 14 disposed from bottom to up;
  a trench 15 penetrating through the first passivation layer 13 and the second passivation layer 14 (refer to FIG. 4); and
  a P-type semiconductor layer 17 located at least on an inner wall of the trench 15.

The semiconductor substrate 10 may be made of a group III nitride material. The group III nitride material may be at least one of GaN, AlGaN, InGaN or AlInGaN.

Materials for the semiconductor substrate 10 may further include: at least one of sapphire, silicon carbide or silicon, or at least one of sapphire, silicon carbide or silicon and a group III nitride material thereon, which is not limited in this embodiment.

The heterojunction structure 11 may include a channel layer 11a and a barrier layer 11b from bottom to up. A two-dimensional electron gas may be formed at an interface between the channel layer 11a and the barrier layer 11b. Specifically, a) the channel layer 11a and the barrier layer 11b may each include one layer; or b) the channel layer 11a and the barrier layer 11b may each include multiple layers, which are alternately distributed; or c) there may include one channel layer 11a and two or more barrier layers 11b to meet different functional requirements.

A combination of materials for the channel layer 11a and the barrier layer 11b may include: GaN/AlN, GaN/InN, GaN/AlGaN, GaAs/AlGaAs, GaN/InAlN, or InN/InAlN.

When a material for the barrier layer 11b is AlGaN, Al may account for 5% to 25% in a molar ratio of AlGaN. The barrier layer 11b may have a thickness in a range from 1 nm to 20 nm.

Between the heterojunction structure 11 and the semiconductor substrate 10, there may include a nucleation layer and a buffer layer (not shown in figure) from bottom to up. A material for the nucleation layer may be, for example, AlN or AlGaN. A material for the buffer layer may be at least one of AlN, GaN, AlGaN or AlInGaN. The nucleation layer can alleviate problems of lattice mismatch and thermal mismatch between an epitaxially grown semiconductor layer, for example, the channel layer 11a in the heterojunction structure 11, and the semiconductor substrate 10. The buffer layer can reduce a dislocation density and a defect density of the epitaxially grown semiconductor layer, and improve a crystal quality.

A material for the cap layer 12 may be GaN. An upper surface of the GaN cap layer may be a Ga surface. GaN crystals have a wurtzite structure, in which Ga and N atomic layers are stacked in a manner of hexagonal layers ABA-BAB, and each Ga(N) atom forms a bond with surrounding 4 N(Ga) atoms in a diamond-like tetrahedral structure. It should be noted that, taking a Ga—N bond parallel to a C axis ([0001] crystal orientation) as a reference, if Ga atoms in each Ga—N bond are farther away from a lower surface, the upper surface is a Ga surface; N atoms in each Ga—N bond are farther away from the lower surface, the upper surface is an N surface.

A material for the first passivation layer 13 may be amorphous AlN. A material for the second passivation layer 14 may be $SiN_x$. In other alternatives, a combination of materials for the second passivation layer 14 and the first passivation layer 13 may be: $SiN_x/SiO_2$, or $SiO_2/SiN_x$. In addition, the material for the second passivation layer 14 may be $SiN_x$ formed through Low Pressure Chemical Vapor Deposition (LPCVD). The material for the first passivation layer 13 may be $SiN_x$ formed through Plasma Enhanced Chemical Vapor Deposition (PECVD).

In the embodiment shown in FIG. 5, the P-type semiconductor layer 17 is a p-AlGaN layer. The p-AlGaN layer is located not only on the inner wall of the trench 15, but also on the second passivation layer 14 in the gate region 1a.

In some embodiments, the P-type semiconductor layer 17 may be a stacked structure of a p-AlGaN layer and a p-GaN layer disposed from bottom to up. At this time, the stacked structure of the p-AlGaN layer and the p-GaN layer is located not only on the inner wall of the trench 15, but also on the second passivation layer 14 in the gate region 1a.

In some embodiments, the P-type semiconductor layer 17 is a p-GaN layer. At this time, there is an AlGaN layer between the p-GaN layer and the cap layer 12. The stacked structure of the AlGaN layer and the p-GaN layer is located not only on the inner wall of the trench 15, but also on the second passivation layer 14 in the gate region 1a.

In some embodiments, the P-type semiconductor layer 17 is a p-GaN layer, and the p-GaN layer is located only in the trench 15.

Figure 6:
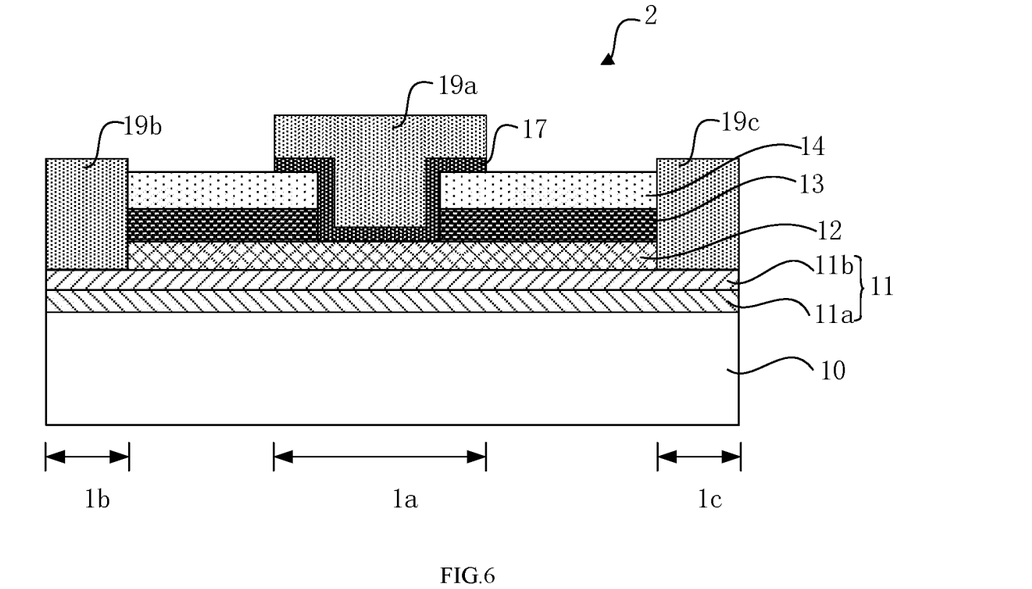
FIG. 6 is a schematic diagram illustrating a cross-sectional structure of an enhanced semiconductor structure according to a second embodiment of the present disclosure.

The second passivation layer 14 can reduce gate leakage current leaked from a channel to a gate 19a in a device (refer to FIG. 6).

Through arrangement of the first passivation layer 13, a non-damaged cap layer 12 can be formed in a process of etching the trench 15. The non-damaged cap layer 12 can effectively reduce surface defects of the heterojunction structure 11 to decrease a probability of electrons being trapped by the defects and further increase a rate of electrons being released back to the gate 19a (refer to FIG. 6), thereby weakening a current collapse effect and reducing a dynamic on-resistance. In another aspect, when a material for the cap layer 12 is GaN, negative polarization charges between the GaN cap layer and the heterojunction structure 11 enable an electric field in the heterojunction structure 11 to be enhanced, which can further increase the rate of electrons being released back to the gate 19a (refer to FIG. 6), thereby weakening the current collapse effect and reducing the dynamic on-resistance.

The enhanced semiconductor structure 1 can be produced and sold as a semi-finished semiconductor device.

Figure 7:
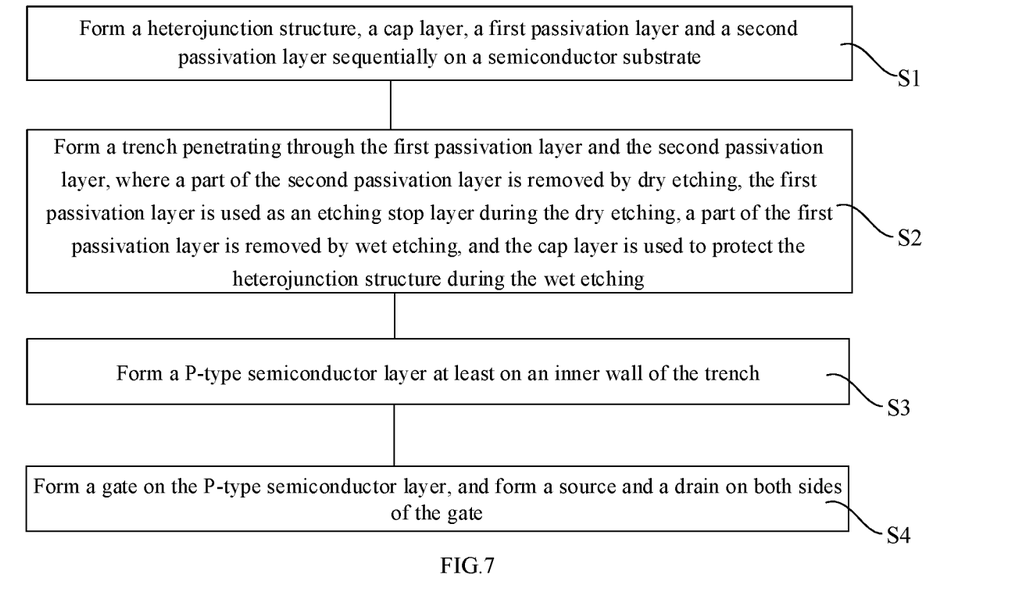
FIG. 7 is a flowchart illustrating a method of manufacturing the enhanced semiconductor structure in FIG. 6.

FIG. 6 is a schematic diagram illustrating a cross-sectional structure of an enhanced semiconductor structure according to a second embodiment of the present disclosure. FIG. 7 is a flowchart illustrating a method for manufacturing the enhanced semiconductor structure in FIG. 6.

Referring to FIGS. 6 and 7, an enhanced semiconductor structure 2 and its manufacturing method according to the second embodiment are substantially the same as the enhanced semiconductor structure 1 and its manufacturing method according to the first embodiment, except that: the enhanced semiconductor structure 2 further includes: a gate 19a located on the P-type semiconductor layer 17; and a source 19b and a drain 19c located on both sides of the gate 19a.

Correspondingly, as shown in FIG. 7, the manufacturing method further includes: step S4, in which, the gate 19a is formed on the P-type semiconductor layer 17, and the source 19b and the drain 19c are formed on both sides of the gate 19a.

Specifically, the second passivation layer 14, the first passivation layer 13 and the cap layer 12 in the source region 1b and the drain region 1c may be removed.

In the second embodiment, the source 19b and the drain 19c are in contact with the barrier layer 11b, and ohmic contacts are formed between the source 19b and the barrier layer 11b, and between the drain 19c and the barrier layer 11b. The gate 19a and the P-type semiconductor layer 17 also form an ohmic contact there-between. A material for the source 19b, the drain 19c and the gate 19a may be a metal, such as Ti/Al/Ni/Au, Ni/Au or other existing conductive materials.

The ohmic contact between the source 19b and the barrier layer 11b, the ohmic contact between the drain 19c and the barrier layer 11b, and the ohmic contact between the gate 19a and the P-type semiconductor layer 17 may be formed by high temperature annealing.

Figure 8:
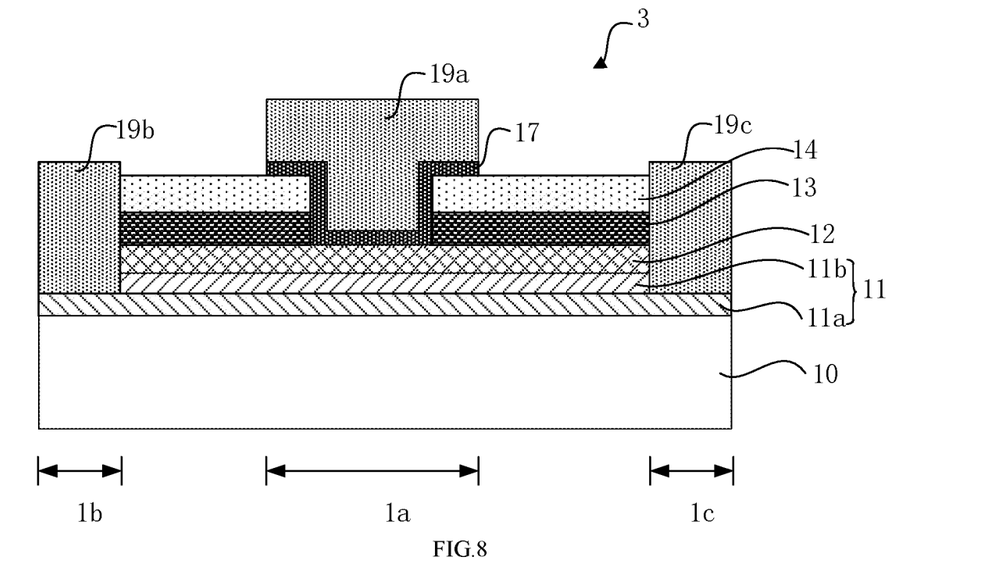
FIG. 8 is a schematic diagram illustrating a cross-sectional structure of an enhanced semiconductor structure according to a third embodiment of the present disclosure.

FIG. 8 is a schematic diagram illustrating a cross-sectional structure of an enhanced semiconductor structure according to a third embodiment of the present disclosure.

Referring to FIG. 8, an enhanced semiconductor structure 3 and its manufacturing method according to the third embodiment are substantially the same as the enhanced semiconductor structure 2 and its manufacturing method according to the second embodiment, except that: the source 19b and the drain 19c are in contact with the channel layer 11a, and ohmic contacts are formed between the source 19b and the channel layer 11a, and between the drain 19c and the channel layer 11a.

Correspondingly, in the step S4 of the manufacturing method, not only the second passivation layer 14, the first passivation layer 13 and the cap layer 12 in the source region 1b and the drain region 1c, but also the barrier layer 11b in the source region 1b and the drain region 1c are removed.

The ohmic contact between the source 19b and the channel layer 11a, and the ohmic contact between the drain 19c and the channel layer 11a may be formed by high temperature annealing.

Figure 9:
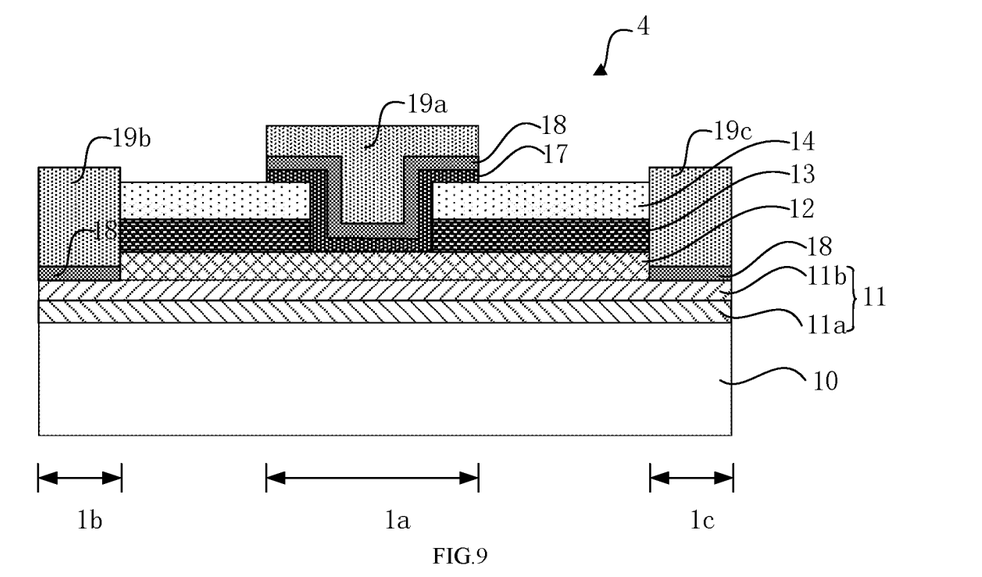
FIG. 9 is a schematic diagram illustrating a cross-sectional structure of an enhanced semiconductor structure according to a fourth embodiment of the present disclosure.

FIG. 9 is a schematic diagram illustrating a cross-sectional structure of an enhanced semiconductor structure according to a fourth embodiment of the present disclosure.

Referring to FIG. 9, an enhanced semiconductor structure 4 according to the fourth embodiment is substantially the same as the enhanced semiconductor structures 2 and 3 according to the second and third embodiments, except that: the enhanced semiconductor structure 4 further includes: N-type ion heavily doped layers 18 are located between the heterojunction structure 11 in the source region 1b and the source 19b, and between the heterojunction structure 11 in the drain region 1c and the drain 19c.

The P-type semiconductor layer 17 and the gate 19a in the gate region 1a also have an N-type ion heavily doped layer 18 there-between.

A material of the N-type ion heavily doped layer 18 may be a group III nitride material, for example, at least one of GaN, AlGaN or AlInGaN. N-type doping ions in the N-type ion heavily doped layer 18 may be at least one of kinds of Si ions, Ge ions, Sn ions, Se ions or Te ions. The corresponding formation method can refer to the process for forming the channel layer 11a or the barrier layer 11b. For different kinds of N-type ions, a doping concentration can be greater than $1E19/cm^3$.

The N-type ion heavily doped layer 18 enables the source 19b and the heterojunction structure 11, the drain 19c and the heterojunction structure 11, and the gate 19a and the P-type semiconductor layer 17 to directly form ohmic contacts there-between without high temperature annealing, which avoids performance of the heterojunction structure 11 from being decreased due to a high temperature during the annealing, and an electron migration rate from being reduced.

In some embodiments, at least one of the P-type semiconductor layer 17, the heterojunction structure 11 in the source region 1b, or the heterojunction structure 11 in the drain region 1c may have the N-type ion heavily doped layer 18 thereon. Ohmic contacts are formed between the gate 19a and the P-type semiconductor layer 17 where the N-type ion heavily doped layer 18 is not provided, between the source 19b and the heterojunction structure 11 in the source region 1b where the N-type ion heavily doped layer 18 is not provided, and between the drain 19c and the heterojunction structure 11 in the drain region 1c where the N-type ion heavily doped layer 18 is not provided by high temperature annealing.

Figure 10:
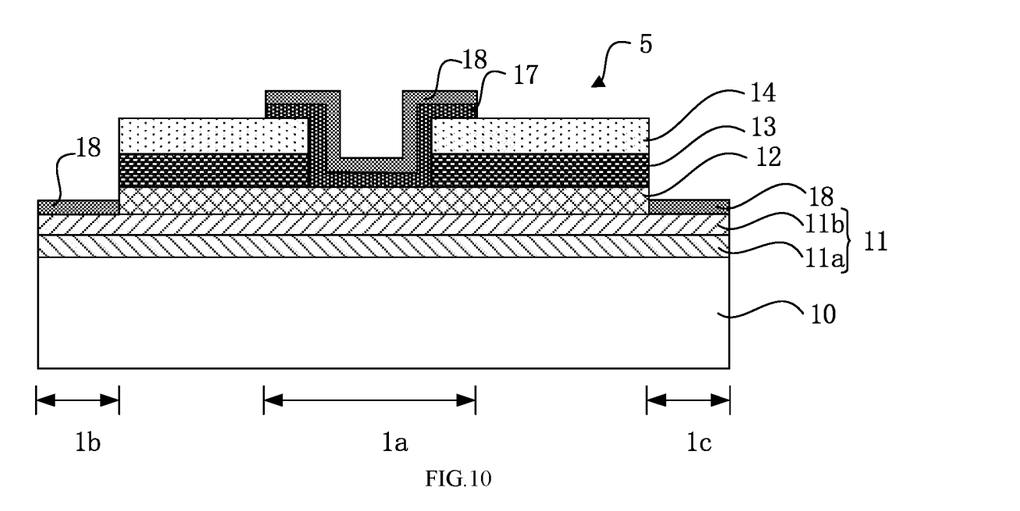
FIG. 10 is a schematic diagram illustrating a cross-sectional structure of an enhanced semiconductor structure according to a fifth embodiment of the present disclosure.

FIG. 10 is a schematic diagram illustrating a cross-sectional structure of an enhanced semiconductor structure according to a fifth embodiment of the present disclosure.

Referring to FIG. 10, an enhanced semiconductor structure 5 and its manufacturing method according to the fifth embodiment is substantially the same as the enhanced semiconductor structure 4 and its manufacturing method according to the fourth embodiment, except that: the enhanced semiconductor structure 5 is an intermediate semiconductor structure, in which the gate 19a, the source 19b and the drain 19c are not manufactured.

Correspondingly, the step S4 is omitted from the manufacturing method.

Although the present disclosure is disclosed as above, the present disclosure is not limited thereto. Any person skilled in the art can make various changes and modifications without departing from the spirit and scope of the present disclosure. Therefore, the protection scope of the present disclosure should be based on the scope defined by the claims.

The invention claimed is:

1. A method of manufacturing an enhanced semiconductor structure, comprising:
    forming a heterojunction structure, a cap layer, a first passivation layer and a second passivation layer sequentially on a semiconductor substrate;
    forming a trench penetrating through the first passivation layer and the second passivation layer, wherein a part of the second passivation layer is removed by dry etching, the first passivation layer is used as an etching stop layer during the dry etching, a part of the first passivation layer is removed by wet etching, and the cap layer is used to protect the heterojunction structure during the wet etching;
    forming a P-type semiconductor layer penetrating through the first passivation layer and the second passivation layer on an inner wall of the trench; and
    forming an N-type ion heavily doped layer on the P-type semiconductor layer, wherein the N-type ion heavily doped layer penetrates through the second passivation layer and part of the first passivation layer;
    wherein a thickness of the P-type semiconductor layer is less than a thickness of the first passivation layer.

2. The method of manufacturing an enhanced semiconductor structure according to claim 1, wherein the P-type semiconductor layer is a p-GaN layer, a p-AlGaN layer, a stacked structure of the p-AlGaN layer and the p-GaN layer, or a stacked structure of an AlGaN layer and a p-GaN layer.

3. The method of manufacturing an enhanced semiconductor structure according to claim 2, wherein
    when the P-type semiconductor layer is the p-GaN layer, the P-type semiconductor layer is selectively grown, and the P-type semiconductor layer is located only in the trench; or
    when the P-type semiconductor layer is the p-AlGaN layer, the P-type semiconductor layer is whole-surface epitaxially grown and is selectively etched, and the p-AlGaN layer is further located on the second passivation layer in a gate region; or
    when the P-type semiconductor layer is a stacked structure of the p-AlGaN layer and the p-GaN layer disposed from bottom to up, the P-type semiconductor layer is whole-surface epitaxially grown and is selectively etched, and the stacked structure of the p-AlGaN layer and the p-GaN layer is further located on the second passivation layer in a gate region; or
    when the P-type semiconductor layer is a stacked structure of the AlGaN layer and the p-GaN layer disposed from bottom to up, the P-type semiconductor layer is whole-surface epitaxially grown and is selectively etched, the stacked structure of the AlGaN layer and the p-GaN layer is further located on the second passivation layer in a gate region.

4. The method of manufacturing an enhanced semiconductor structure according to claim 1, wherein a combination material of the second passivation layer and the first passivation layer comprises: SiNx/amorphous AlN, SiNx/SiO2, or SiO2/SiNx.

5. The method of manufacturing an enhanced semiconductor structure according to claim 1, wherein a material of the cap layer comprises GaN.

6. The method of manufacturing an enhanced semiconductor structure according to claim 1, further comprising:
forming a gate on the P-type semiconductor layer, and forming a source and a drain on both sides of the gate.

7. The method of manufacturing an enhanced semiconductor structure according to claim 6, wherein the heterojunction structure comprises a channel layer and a barrier layer from bottom to up, and the source and the drain are in contact with the channel layer or the barrier layer.

8. An enhanced semiconductor structure, comprising:
a semiconductor substrate, a heterojunction structure, a cap layer, a first passivation layer and a second passivation layer disposed from bottom to up;
a trench penetrating through the first passivation layer and the second passivation layer;
a P-type semiconductor layer penetrating through the first passivation layer and the second passivation layer located at least on an inner wall of the trench; and
an N-type ion heavily doped layer on the P-type semiconductor layer, wherein the N-type ion heavily doped layer penetrates through the second passivation layer and part of the first passivation layer;
wherein a thickness of the P-type semiconductor layer is less than a thickness of the first passivation layer.

9. The enhanced semiconductor structure according to claim 8, wherein
the P-type semiconductor layer is a p-GaN layer;
the P-type semiconductor layer is a p-AlGaN layer, and the p-AlGaN layer is further located on the second passivation layer in a gate region;
the P-type semiconductor layer is a stacked structure of a p-AlGaN layer and a p-GaN layer disposed from bottom to up, and the stacked structure of the p-AlGaN layer and the p-GaN layer is further located on the second passivation layer in a gate region; or
the P-type semiconductor layer is a p-GaN layer, an AlGaN layer is between the p-GaN layer and the cap layer, and a stacked structure of the AlGaN layer and the p-GaN layer is further located on the second passivation layer in a gate region.

10. The enhanced semiconductor structure according to claim 8, wherein a combination of materials of the second passivation layer and the first passivation layer comprises: SiNx/amorphous AlN, SiNx/SiO2, or SiO2/SiNx.

11. The enhanced semiconductor structure according to claim 8, wherein a material of the cap layer comprises GaN.

12. The enhanced semiconductor structure according to claim 8, wherein the heterojunction structure comprises a group III nitride material.

13. The enhanced semiconductor structure according to claim 8, further comprising: a gate located on the P-type semiconductor layer; and a source and a drain located on both sides of the gate.

14. The enhanced semiconductor structure according to claim 13, wherein the heterojunction structure comprises a channel layer and a barrier layer from bottom to up, and the source and the drain are in contact with the channel layer or the barrier layer.

15. The enhanced semiconductor structure according to claim 9, further comprising: an N-type ion heavily doped layer on the heterojunction structure in a source region, and/or the heterojunction structure in a drain region.

16. The enhanced semiconductor structure according to claim 15, further comprising: a gate located on the N-type ion heavily doped layer in the gate region, a source located on the N-type ion heavily doped layer in the source region, and a drain located on the N-type ion heavily doped layer in the drain region.

17. The enhanced semiconductor structure according to claim 15, wherein a material of the N-type ion heavily doped layer comprises a group III nitride material.

* * * * *